United States Patent [19]

Skowronski

[11] Patent Number: 5,655,933
[45] Date of Patent: Aug. 12, 1997

[54] POWER DISTRIBUTION SYSTEM

[75] Inventor: David M. Skowronski, Naperville, Ill.

[73] Assignee: Molex Incorporated, Lisle, Ill.

[21] Appl. No.: 434,626

[22] Filed: May 4, 1995

[51] Int. Cl.[6] .................................................. H01R 25/00
[52] U.S. Cl. ......................... 439/654; 439/79; 29/844
[58] Field of Search ........................ 439/79, 638–654, 439/76; 29/844

[56] References Cited

U.S. PATENT DOCUMENTS

| 4,313,646 | 2/1982  | Millhimes et al. | 339/156 R |
| 4,392,701 | 7/1983  | Weidler          | 439/638   |
| 4,684,198 | 8/1987  | Becraft et al.   | 439/638   |
| 4,729,740 | 3/1988  | Crowe et al.     | 439/76    |
| 5,154,618 | 10/1992 | Riholoff et al.  | 439/640   |
| 5,340,333 | 8/1994  | Schroth          | 439/638   |
| 5,406,450 | 4/1995  | Shieh            | 439/638   |
| 5,411,401 | 5/1995  | Chiou            | 439/638   |

FOREIGN PATENT DOCUMENTS 2073962   4/1980   United Kingdom .............. H01R 9/11

*Primary Examiner*—David L. Pirlot
*Attorney, Agent, or Firm*—Stephen Z. Weiss

[57] ABSTRACT

A system is provided for distributing power between connectors in a connector raceway. At least two spaced-apart connectors each include a housing and a plurality of terminals mounted on the housing. A plurality of conductive wires have first ends respectively attached to the terminals and extend from each connector in the connector raceway toward the other connector. A printed circuit board is mounted in the connector raceway between the connectors and includes circuit traces thereon. Second ends of the conductive wires are electrically secured to the circuit traces. Therefore, one connector is electrically coupled to the other connector through the circuit board in the connector raceway.

17 Claims, 5 Drawing Sheets

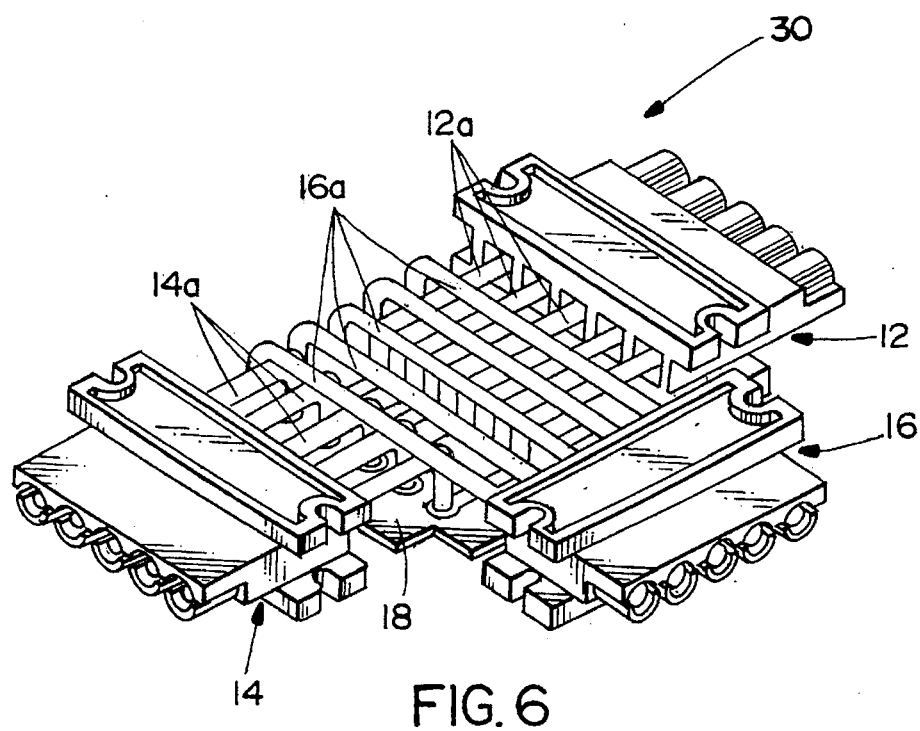
FIG. 6
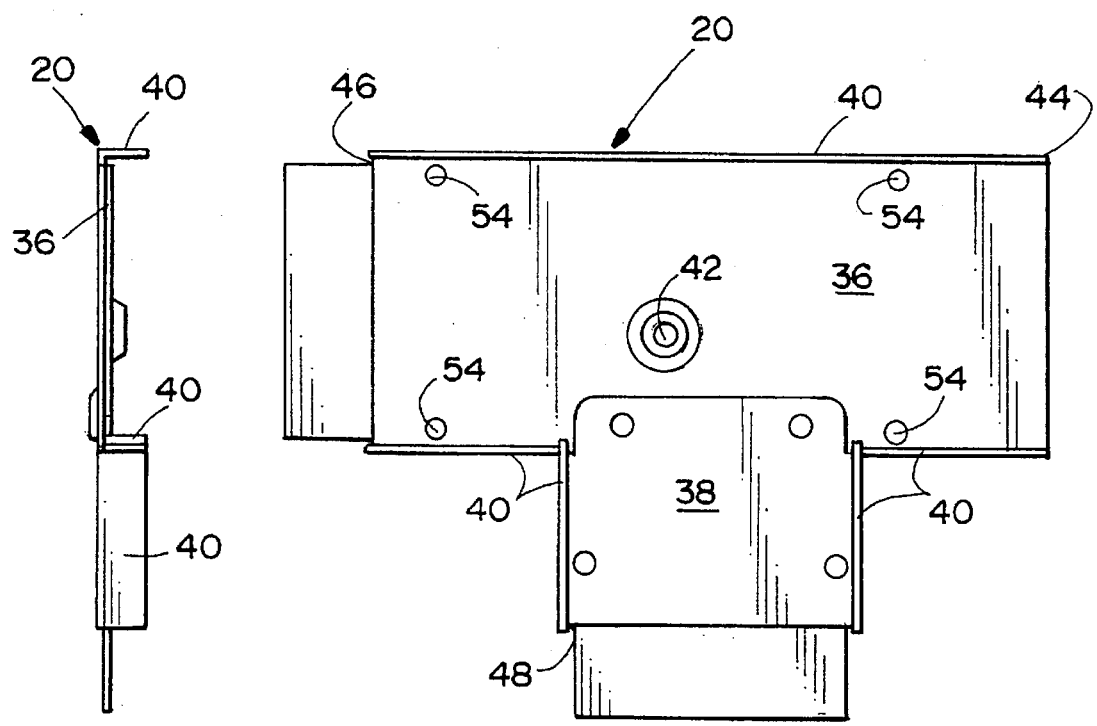
FIG. 8
FIG. 7

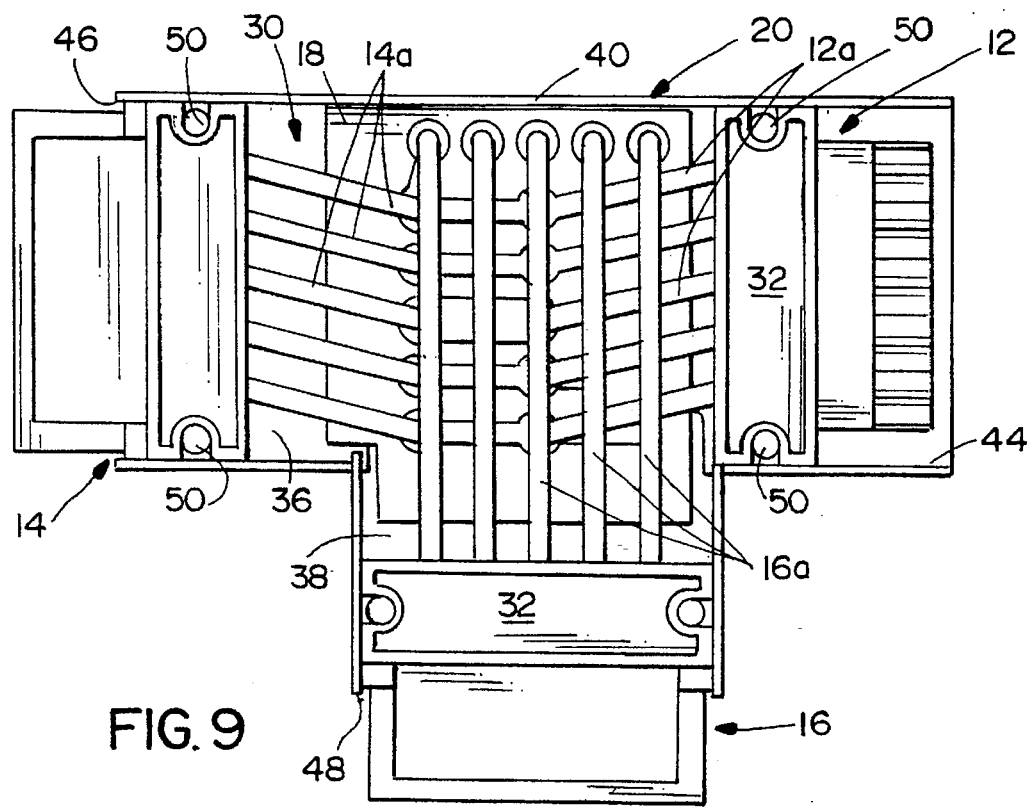
FIG. 9
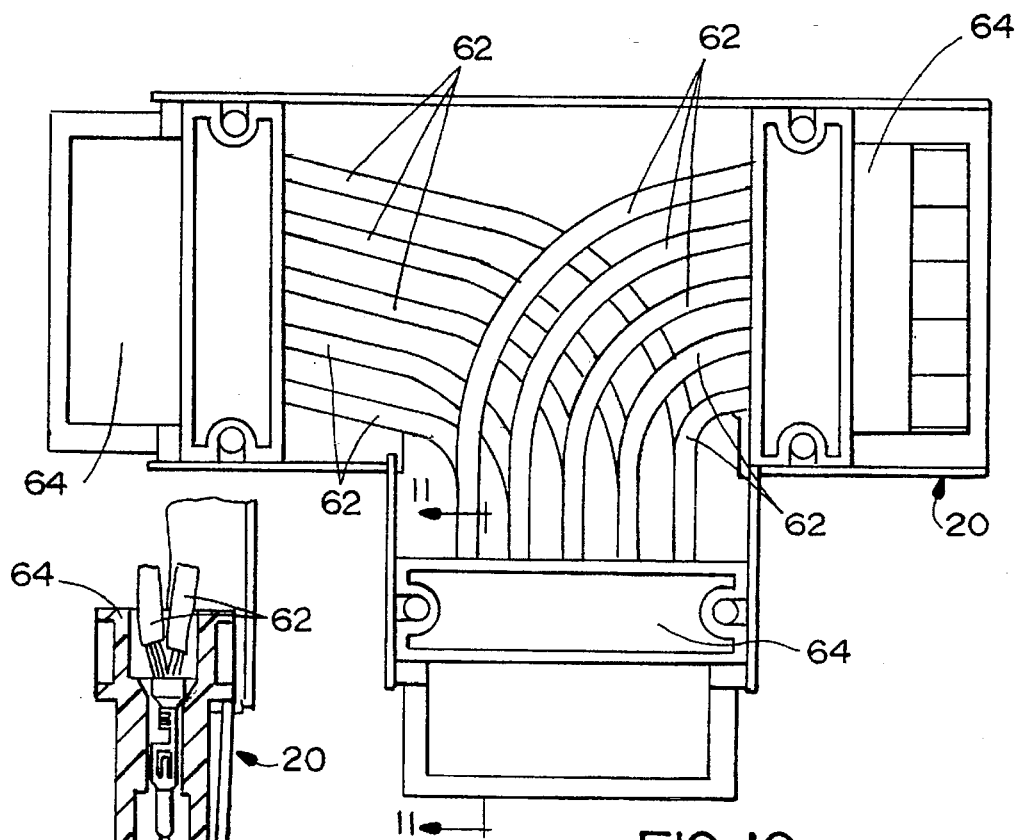
FIG. 10 (PRIOR ART)
FIG. 11 (PRIOR ART)

5,655,933

POWER DISTRIBUTION SYSTEM

FIELD OF THE INVENTION

This invention generally relates to the art of electrical wiring systems and, particularly, to a power distribution system between at least a pair of electrical connectors, such as in modular wall panel systems.

BACKGROUND OF THE INVENTION

In modular space dividers, wall panel systems and modular lighting systems, electrical current is provided in the movable walls, panels and lighting fixtures. A track such as along the bottom edges of the panels, is provided with outlets at predetermined locations along the track. The outlets may comprise outlet boxes, and electrical wiring extends between the boxes within the track. Light fixture housings have outlets to bring power into the housing fixtures. A power distribution system is included and often includes a "splitter" arrangement wherein power from a given wiring array is split into two or more directions, usually through separate electrical connectors.

Heretofore, power distribution systems have included electrical connectors spaced apart within the connector raceway and electrically coupled by means of conductive metal bus bars interconnected between the terminals of the connectors. An example of the use of bus bars is disclosed in U.S. Pat. No. 4,313,646, issued on Feb. 2, 1982 to W. L. Millhimes et al. Such bus bar arrangements cause problems or difficulties in that the bus bars must be maintained separate from one another. Such an arrangement is also excessively expensive. In addition, problems are created in obtaining approval from governmental or other agencies for meeting building or electrical codes because the bus bars form exposed power conductors.

Other power distribution systems use insulated electrical wires directly connected between the terminals of the spaced-apart connectors. Direct wire connections have created problems because, as shown in FIG. 10, in order to reduce the space taken up by the insulated wires in the raceway, each wire has a different length. This requires extra labor and makes the insertion of the terminals connected to the shorter wires more difficult because a shorter wire length is more difficult to maneuver. In addition, when splitting the wires into two or more distribution arrays, double crimps are required on the wires as shown in FIG. 11. These double crimp connections are difficult to make and, because of the double wire thickness, reduction of the depth of the connector raceway is not possible.

The present invention is directed to solving the above problems and providing an extremely simple and inexpensive power distribution system which employs a printed circuit board in the system.

SUMMARY OF THE INVENTION

An object, therefore, of the invention is to provide a new and improved power distribution system of the character described, and particularly a power distribution system for interconnecting a plurality of connectors by conductive electrical wires.

In the exemplary embodiment of the invention, the power distribution system is adapted for interconnecting a plurality of connectors in a track used in modular wall panel systems or interconnecting a plurality of lighting fixtures. At least two spaced-apart connectors each include a housing and a plurality of terminals mounted on the housing. A plurality of conductive wires have first ends respectively attached to the terminals and extend from each connector in the connector raceway toward the other connector. A printed circuit board is mounted in the connector raceway between the connectors and includes circuit traces thereon. Second ends of the conductive wires are electrically secured to the circuit traces on the board. Therefore, one connector is electrically coupled to the other connector in the connector raceway through the circuit board.

The invention also contemplates a novel grounding system. In particular, at least a portion of the raceway is conductive. The printed circuit board includes a ground circuit. Connecting means interconnect the ground circuit to the conductive raceway. At least one conductive wire from at least one connector comprises a ground wire secured to the ground circuit. Preferably, the connecting means is a conductive fastening means for mounting the printed circuit board to the raceway.

As disclosed herein, all of the conductive wires attached to the terminals of each connector are of substantially equal length. The raceway defines an axis between the spaced-apart connectors. The printed circuit board is generally planar and is disposed generally parallel to the axis. The conductive wires are secured to the circuit traces generally perpendicular to the planar printed circuit board and are bent generally parallel to the axis for attachment to the terminals of the connectors.

Lastly, the power distribution system is disclosed herein as a "splitter" arrangement. In particular, the raceway has two collinear portions within which the two spaced-apart connectors are mounted. A T-branch portion of the raceway mounts a third connector therewithin. The third connector is coupled to the printed circuit board by further conductive wires.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 6 is a view similar to that of FIG. 4, but with the conductors of the third connector bent such that the third connector is transverse to the other two connectors;

FIG. 7 is a top plan view of the connector raceway portion or backshell;

FIG. 8 is a side elevational view looking toward the left-hand side of FIG. 7;

FIG. 9 is a top plan view of the connector raceway portion of FIG. 7, with the subassembly of FIG. 6 mounted therewithin;

FIG. 10 is a view similar to that of FIG. 9, but according to the prior art; and FIG. 11 is a section view of FIG. 10.

DETAILED DESCRIPTION OF THE PREFERRED EMBODIMENT

Figure 1:
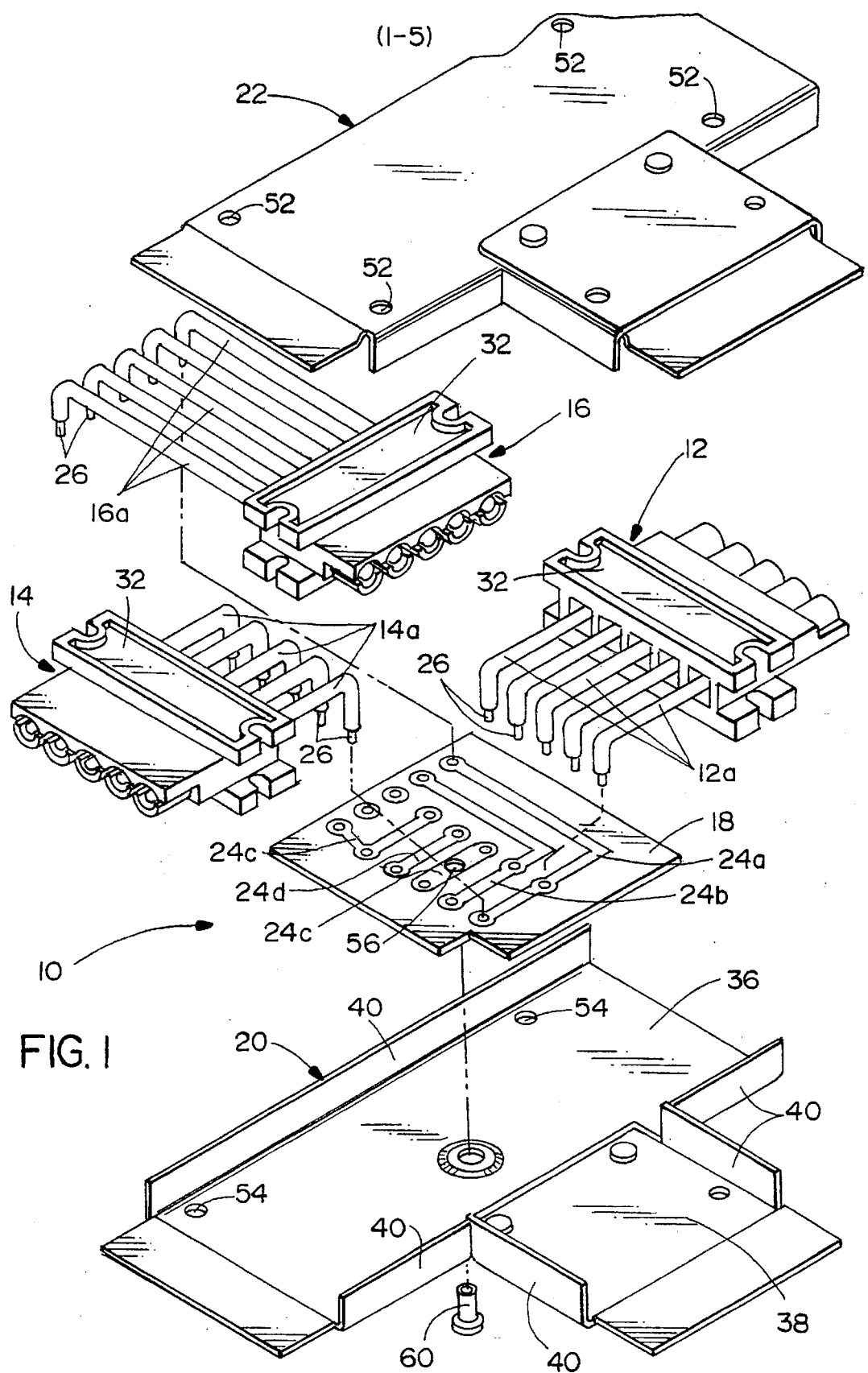
FIG. 1 is an exploded perspective view of a power distribution system embodying the concepts of the invention.

Referring to the drawings in greater detail, and first to FIG. 1, the invention is incorporated in a power distribution system, generally designated 10, for distributing power between a plurality of electrical connectors, generally designated 12, 14 and 16. The connectors are electrically coupled to a printed circuit board 18 by means of a plurality of insulated conductive wires 12a for connector 12, 14a for connector 14 and 16a for connector 16. A subassembly (as seen more clearly hereinafter) of connectors 12–16, along with their respective conductive wires 12a–16a, and printed circuit board 18, is mounted within a backshell which includes a bottom plate, generally designated 20, and a top cover, generally designated 22. Actually, the backshell, including the bottom plate and the top cover, form a portion of a connector raceway which can be used to contain circuitry and distribute power in a space divider or modular wall panel arrangement or system.

Figure 2:
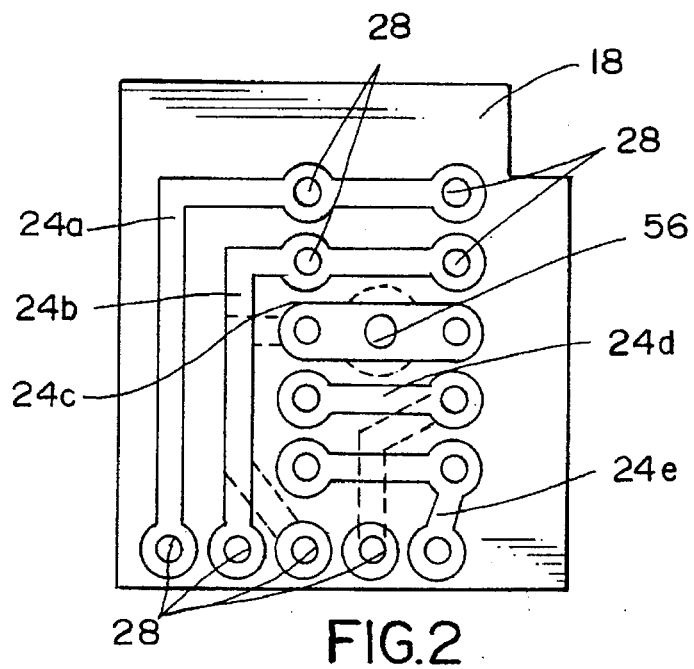
FIG. 2 is a plan view of the printed circuit board.

FIG. 2 shows printed circuit board 18 to include a plurality of circuit traces 24a–24e thereon. These five circuit traces are used to interconnect the five insulated conductive wires 12a, 14a and 16a from each of connectors 12, 14 and 16, respectively. It can be seen in FIG. 1 that all of the conductive wires have been stripped of their insulation at the distal ends thereof to expose the conductive cores 26 of the wires at the tips thereof. The conductive core tips are inserted into holes 28 (FIG. 2) of printed circuit board 18, through circuit traces 24a–24e, with the cores electrically connected to the circuit traces, as by soldering. The invention contemplates that at least one circuit trace 24c comprise a ground circuit.

Figure 3:
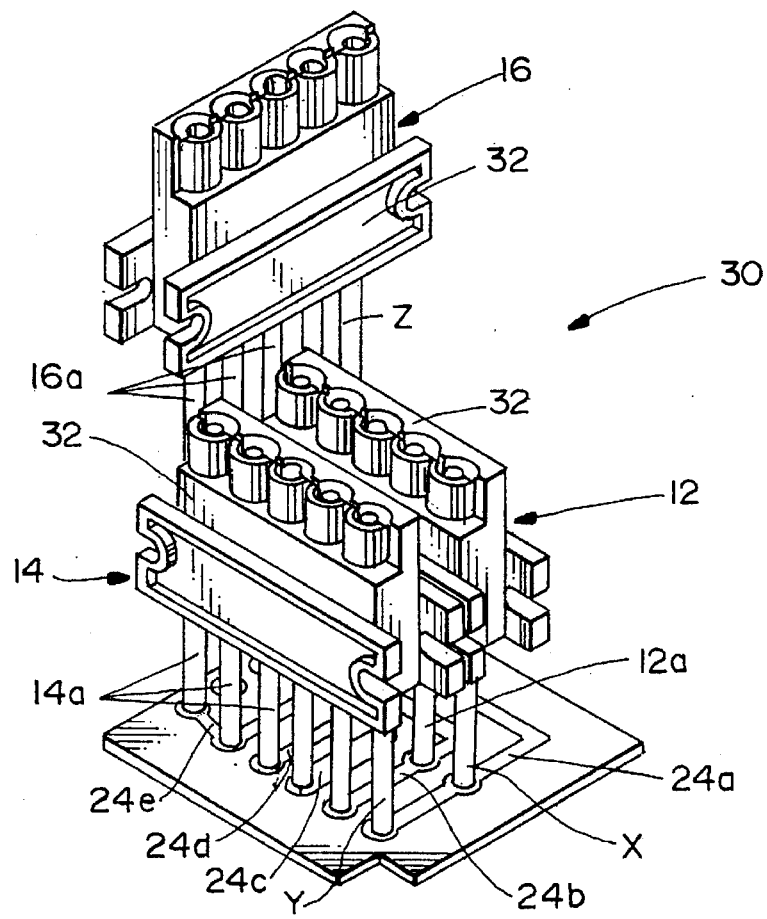
FIG. 3 is a perspective view of the subassembly including the printed circuit board along with three connectors respectively coupled to the board by a plurality of insulated conductive wires.

FIG. 3 shows a subassembly, generally designated 30, which includes connectors 12–16, conductive wires 12a–16a and printed circuit board 18. Each conductive wire is terminated to a terminal (not shown) within a housing 32 of the respective connector. The array of circuit traces on printed circuit board 18 is such that each circuit trace electrically interconnects one conductive wire from each connector. For example, by comparing FIGS. 2 and 3, it can be seen that conductive wire "x" of connector 12, conductive wire "y" of connector 14 and conductive wire "z" of connector 16 all are electrically interconnected or coupled by circuit trace 24a on printed circuit board 18. Similarly, each other circuit trace, including ground circuit 24c, electrically couples a conductive wire from each connector and distributes the power between the connectors in a predetermined scheme as dictated by the circuit traces on the board. Lastly, FIG. 3 clearly shows that all of the conductive wires for each connector are efficiently and inexpensively provided of equal lengths. In other words, the lengths of conductive wires 12a of connector 12 are equal; the lengths of conductive wires 14a of connector 14 are equal; and the lengths of conductive wires 16a of connector 16 are equal. This enables the wires to be very easily soldered to the circuit traces on the printed circuit board in an upright manner as is shown in FIG. 3.

Figure 4:
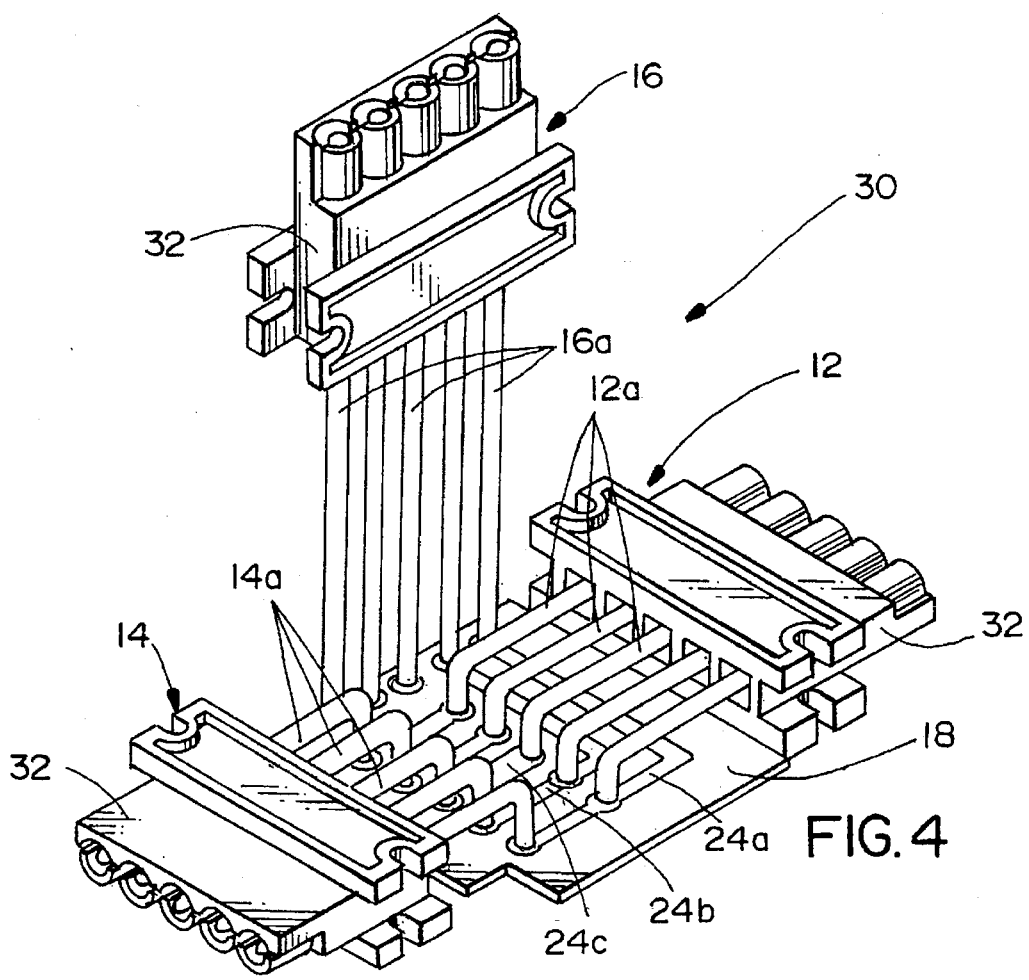
FIG. 4 is a perspective view of the subassembly of FIG. 3, with the conductive wires of two of the connectors bent such that the connectors are collinear.
Figure 5:
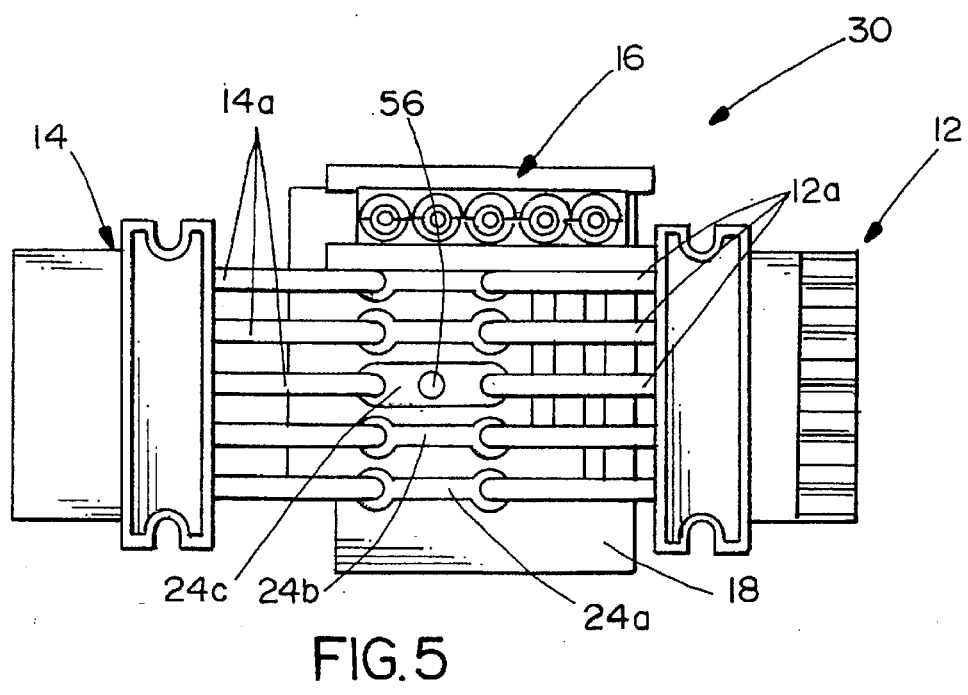
FIG. 5 is a top plan view of the subassembly as shown in FIG. 4.

Referring to FIGS. 4 and 5 in conjunction with FIG. 3, the next step in fabricating subassembly 30 is to bend conductive wires 12a of connector 12 and conductive wires 14a of connector 14 such that the two connectors point in opposite directions in a collinear array as is clearly seen in FIGS. 4 and 5. Conductive wires 16a of connector 16 remain in an extended or upright condition relative to printed circuit board 18 as seen best in FIG. 4.

FIG. 6 shows the final step in fabricating subassembly 30, wherein conductive wires 16a of connector 16 are bent over the top of the previously bent wires 12a and 14a of connectors 12 and 14, respectively, such that connector 16 points or faces generally perpendicular to the collinear array of connectors 12 and 14. In essence, it now can be seen how the power distribution system of the invention can serve as a power "splitter". In other words, if connector 12 is considered an input connector, connectors 14 and 16 can be output connectors in perpendicular directions, with all of the connectors electrically coupled by circuit traces 24a–24e on printed circuit board 18, as described above.

Before proceeding with a description of mounting subassembly 30 in the backshell or connector raceway, reference is made to FIGS. 7 and 8 which show the configuration of bottom plate 20 of the connector raceway portion. The bottom plate is generally T-shaped to include a linear portion 36 and a branch portion 38. Upright walls or flanges 40 bound the sides of the linear and branch portions to define channels therebetween. Preferably, at least linear portion 36 is fabricated of conductive material, such as metal, and a hole 42 is formed therein generally centrally thereof. In comparing FIGS. 7 and 8 with the perspective view of FIG. 1, it can be seen how top cover 22 combines with bottom plate 20 to define an enclosure for subassembly 30 after the subassembly is configured as shown in FIG. 6. In essence, when the top cover and bottom plate are assembled together, an opening 44 is formed about connector 12, an opening 46 is formed about connector 14 and an opening 48 is formed about connector 16. Complementary electrical connectors (not shown) then can be mated with connectors 12–16 either through openings 44–48 or to the mating faces of the connectors exposed at the openings.

FIG. 9 shows the finally configured subassembly 30 (as configured in FIG. 6) mounted within bottom plate 20 of the connector raceway. It can be seen that connector 12 is exposed through opening 44, connector 14 is exposed through opening 46 and connector 16 is exposed through opening 48, all to allow mating with complementary connectors. Printed circuit board 18 seats on linear portion 36 of bottom plate 20. Housings 32 of the connectors are provided with through holes 50 which are aligned with holes 52 (FIG. 1) in top cover 22 and holes 54 in bottom plate 20 for receiving appropriate fasteners, such as bolts, screws or the like, to hold the entire assembly together.

As stated above in relation to FIG. 2, circuit trace 24c on printed circuit board 18 has been made to form a ground circuit of the system. A hole 56 in the ground circuit is aligned with hole 42 (FIGS. 1 and 7) in linear portion 36 of bottom plate 20. Therefore, a conductive member, such as a rivet 60 (FIG. 1), can be inserted through the holes to ground the circuit trace on the board to the conductive bottom plate. The respective conductive wires from connectors 12–16 which are electrically coupled to ground circuit 24c of the printed circuit board thereby can be used to ground the connectors to the connector raceway or backshell itself. Still further, rivet 60 can be used to perform the dual function of physically or mechanically mounting printed circuit board 18 to the raceway.

Lastly, FIGS. 10 and 11 show an arrangement of the prior art which has been designed to look similar to FIG. 9 according to the invention. However, rather than using a circuit board, it can be seen how the conductors 62 of a plurality of connectors 64 are "wired" directly between the connectors. It clearly can be seen that the conductive wires are of different lengths. Otherwise, if the wires were not of different lengths, the wires would become very entangled within the raceway or the raceway would not even have enough space to accommodate the wires. In addition, it can be seen that the wires from two connectors all are connected to the single third connector. This requires special terminals and/or double crimps which are difficult to make. Aside from the very cumbersome and time-consuming procedures required to fabricate and assemble the power distribution system of FIG. 10, the increased inventory of different lengths of conductive wires and different terminals add further to the costs of such distribution systems. FIG. 11 is a section view of a portion of the prior art connector in FIG. 10 showing the space taken up by the double wire crimp within the connector raceway.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A system for distributing power between connectors in a connector raceway, comprising:

at least two spaced-apart connectors and a third connector each including a housing and a plurality of terminals mounted on the housing;

a plurality of conductive wires having first ends respectively attached to the terminals and extending from each connector in the raceway;

a printed circuit board mounted in the raceway between the connectors and including circuit traces thereon with second ends of the conductive wires electrically secured to the circuit traces; and said raceway having two collinear portions within which said at least two spaced-apart connectors are mounted, and including a T-branch portion mounting the third connector therewithin and the conductive wires extending from the third connector bent transversely over the conductive wires extending from the at least two spaced apart connectors;

whereby each connector is electrically coupled to the other connector in the raceway through the circuit board.

2. The system of claim 1 wherein all of the conductive wires attached to the terminals of at least one of said connectors are of substantially equal length.

3. The system of claim 1 wherein at least a portion of said raceway is conductive, the printed circuit board includes a ground circuit, and including means connecting the ground circuit to the conductive raceway.

4. The system of claim 3 wherein at least one conductive wire from at least one connector comprises a ground wire secured to said ground circuit.

5. The system of claim 3 wherein said connecting means comprise conductive fastening means for mounting the printed circuit board in the raceway.

6. The system of claim 1 wherein said raceway defines an axis between said spaced-apart connectors, with said printed circuit board being generally planar and disposed generally parallel to the axis.

7. The system of claim 6 wherein said conductive wires are secured to the circuit traces generally perpendicular to the planar printed circuit board and are bent generally parallel to said axis for attachment to the terminals of the connectors.

8. The system of claim 7 wherein all of the conductive wires attached to the terminals of at least one of said connectors are of substantially equal length.

9. A system for distributing power between electrical connectors, comprising:

a backshell;

at least two spaced-apart connectors disposed on the backshell to define an axis therebetween;

a plurality of conductive wires having first ends respectively attached to terminal means and extending from each connector in the backshell toward the other connector;

a printed circuit board mounted in the backshell between the connectors and including circuit traces thereon with second ends of the conductive wires electrically secured to the circuit traces, the printed circuit board being planar and disposed generally parallel to the axis, and the conductive wires being secured to the circuit traces generally perpendicular to the planar printed circuit board and being bent generally parallel to said axis for attachment to the terminal means of the connectors; and said backshell including a collinear portion mounting said at least two connectors and a T-branch portion mounting a third connector, and including a plurality of conductive wires electrically secured to circuit traces on the printed circuit board and to terminal means on the third connector and bent transversely over the conductive wires of said two connectors.

10. The system of claim 9 wherein all of the conductive wires attached to the terminal means of at least one of said connectors are of substantially equal length.

11. The system of claim 9, including a third connector on the backshell with a plurality of conductive wires from the third connector being secured to the circuit traces on the printed circuit board in a manner such that the conductive wires from one of said at least two connectors are electrically coupled to the conductive wires of the second of the at least two connectors as well as the third connector to define a power splitter arrangement.

12. The system of claim 9 wherein at least a portion of said backshell is conductive, the printed circuit board includes a ground circuit, and including means connecting the ground circuit to the conductive raceway.

13. The system of claim 12 wherein at least one conductive wire from at least one connector comprises a ground wire secured to said ground circuit.

14. The system of claim 12 wherein said connecting means comprise conductive fastening means for mounting the printed circuit board in the backshell.

15. A method of fabricating a power distribution system between connectors in a raceway, comprising the successive steps of:

providing a backshell forming a portion of the raceway;

forming a subassembly which includes (a) at least two electrical connectors, (b) a planar printed circuit board including circuit traces thereon, and (c) a plurality of conductive wires interconnected between the at least two connectors and the circuit traces on the printed circuit board;

securing the conductive wires to the circuit traces generally perpendicular to the planar printed circuit board;

bending the conductive wires such that the wires are generally parallel to the planar printed circuit board; and mounting said subassembly onto the backshell.

16. The method of claim 15 wherein said conductive wires are bent such that the two connectors extend in opposite directions along an axis generally parallel to the planar printed circuit board.

17. The method of claim 15 wherein the subassembly further includes a third electrical connector with a plurality of insulated conductive wires interconnected between the third connector and the circuit traces on the printed circuit board and bending the insulated conductive wires from the third connector over the insulated conductive wires from the at least two connectors after the insulated conductive wires from the at least two connectors are bent.

* * * * *